United States Patent [19]

Ohdate

[11] Patent Number: 4,760,037
[45] Date of Patent: Jul. 26, 1988

[54] PRESSURE CONTACT TYPE SEMICONDUCTOR DEVICE

[75] Inventor: Mituo Ohdate, Fukuoka, Japan

[73] Assignee: Mitsubishi Denki Kabushiki Kaisha, Tokyo, Japan

[21] Appl. No.: 914,575

[22] Filed: Oct. 3, 1986

Related U.S. Application Data

[62] Division of Ser. No. 770,776, Aug. 29, 1985, abandoned.

[30] Foreign Application Priority Data

Mar. 9, 1984 [JP] Japan ................. 59-134801

[51] Int. Cl.⁴ ........................................... H01L 23/02
[52] U.S. Cl. ........................................ 437/224; 29/511; 357/79
[58] Field of Search ...................... 437/224; 29/511

[56] References Cited

U.S. PATENT DOCUMENTS 3,474,302 10/1969 Blundell ..................... 357/79
3,512,249 5/1970 Lewis ......................... 357/79
3,683,492 8/1972 Meyerhoff et al. .......... 29/511 X
3,743,896 7/1973 Weiske et al. .............. 357/79
3,950,778 4/1976 Pomper et al. .............. 357/79

FOREIGN PATENT DOCUMENTS 1489791 6/1969 Fed. Rep. of Germany .
1809057 10/1969 Fed. Rep. of Germany .
2650098 3/1978 Fed. Rep. of Germany .
46-35213 10/1971 Japan .

Primary Examiner—Olik Chaudhuri
Attorney, Agent, or Firm—Wendroth, Lind & Ponack

[57] ABSTRACT

A method of manufacturing the present invention relates to a semiconductor device by providing a projection formed by pressing the side wall portion of a metal cylindrical body from the outside toward the inside of the cylindrical body and engaging the outer peripheral edge of the upper surface of the cylindrical elastic member contained in the cylindrical body with the projection.

2 Claims, 2 Drawing Sheets

PRESSURE CONTACT TYPE SEMICONDUCTOR DEVICE

This application is a division, of now abandoned application Ser. No. 770,776, filed Aug. 29, 1985.

BACKGROUND OF THE INVENTION

The present invention relates to a method of forming a pressure-contact typ semiconductor device.

FIG. 1 is a sectional view showing a conventional pressure-contact type semiconductor device disclosed in Japanese Published Patent specification No. Sho. 46-35213.

In FIG. 1, the reference numeral 1 designates a diode element in which an anode is formed on one main surface and a cathode is formed on the other main surface. The numeral 2 designates an anode conductor, and the numeral 3 designates a cathode conductor. The anode conductor is formed of a copper post in which a recess portion 2a for containing the diode element 1 is formed at one end and a mounting bolt 2b is provided at the center of the other end, and a mounting bolt 2b is provided at the center of the other end. The anode of the diode element 1 is pressure contacted with the bottom surface of the recess portion 2a. The cathode conductor 3 is made of a copper material, and has a plate-shaped portion pressure contacted with the cathode of the diode element 1, and a cathode leading rod at the central part of the plate-shaped portion. The numeral 4 designates an insulating washer. The numeral 5 designates a metal washer. The numerals 6a, 6b and 6c designate leaf springs. The numeral 7 designates a metal cylindrical body. The numeral 8 designates projections provided at the cylindrical body 7. The projections 8 are formed to be engaged with the outer peripheral edge of the upper surface of the upper stage 6c of the leaf springs 6a, 6b and 6c of compressed state at a plurality of positions in a circumferential direction of the side wall of the cylindrical body 7. These projections 8 have a function for pressure contacting the cathode conductor 3 with the cathode of the diode element 1 by the spring pressures of the leaf springs 6a, 6b and 6c of compressed state and for pressure contacting the anode of the diode element 1 with the recess portion 2a of the anode conductor 2.

FIG. 2 is a sectional view of the essential portion for describing one method of forming a projection for engaging the leaf springs of compressed state with the side wall of the metal cylinder of the conventional example.

In FIG. 2, the same reference numerals are used to designate the same or corresponding parts or elements as those shown in FIG. 1.

The leaf springs 6a, 6b and 6c are first pressed in a compressed state by a tubular pressing jig 50. The outer diameter of the tubular body of the jig 50 is smaller than that of the leaf spring 6c as shown in FIG. 1. Further, the inner diameter of the tubular body is larger than the outer diameter of the cathode leading rod. Then, a plurality of positions (the portions corresponding to the outer peripheral edges of the leaf spring 6c) on the periphery of the side wall of the cylindrical body 7 are broken by the ends of bites 51, thereby forming the projections 8 engaged with the outer peripheral edge of the upper surface of the leaf spring 6c.

The projections 8 of the conventional example are formed as described above. Thus, if the distance (designated by h) between the lower surfaces of the bites 51 and the outer peripheral edge of the upper surface of the leaf spring 6c of the leaf springs 6a, 6b and 6c of compressed state becomes close to 0, the ends of the bites 51 damage the leaf spring 6c when the ends of the bites 51 break the side wall of the cylindrical body 7. If the distance h is increased in order to prevent the damage of the leaf spring 6c, the leaf spring 6c might not be engaged with the projections 8 when the jig 50 is removed after the projections 8 are formed. Therefore, it is not easy to form the projections 8 so that the spring pressures of the leaf springs 6a, 6b and 6c become a predetermined value.

Furthermore, when the projections 8 are formed by breaking the side wall of the cylindrical body 7 by the ends of the bites 51, small broken pieces might be generated from the forming portions of the projections 8 of the side wall of the cylindrical body 7. These broken pieces fall down on the portion between the metal washer 5 of the insulating washer 4 and the cathode leading rod of the cathode conductor 3, as exemplified by the reference character A in FIG. 2, when the leaf spring 6c is engaged with the projections 8 by removing the jig 50, and cause a short-circuit between the anode and the cathode of the diode element 1, thereby lowering the electric characteristics.

SUMMARY OF THE INVENTION

The present invention is directed to solve the problems pointed out above, and has for its object to provide a pressure-contact type semiconductor device in which projections are provided on part of the entire periphery, or on a plurality of portions of part of the side wall, of a metal cylindrical body by pressing from the outside toward the inside, thereby readily setting the spring pressures of the leaf springs to a predetermined value.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

BRIEF DESCRIPTION OF THE DRAWINGS

The same reference numerals designate the same or corresponding parts or elements.

DETAILED DESCRIPTION OF THE PREFERRED EMBODIMENTS

Figure 1:
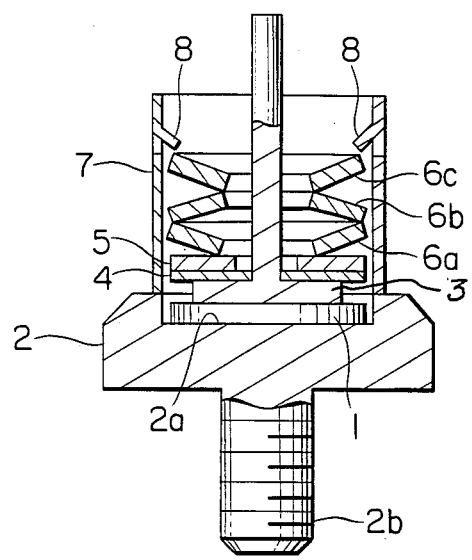
FIG. 1 is a cross-sectional view of an example of a prior art pressure-contact type semiconductor device.
Figure 2:
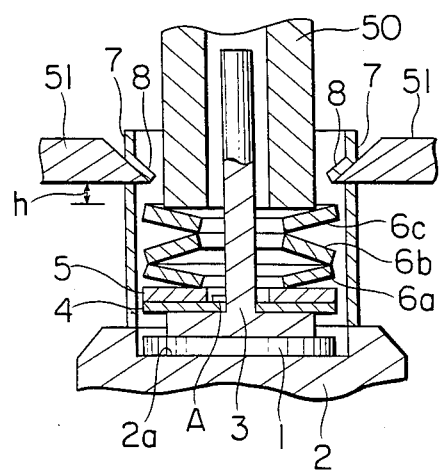
FIG. 2 is a cross-sectional view of the essential portion for explaining the method of production of the projections engaged with the leaf springs of compressed state at the side wall of the cylindrical body of the prior art example.

In the drawings, the same reference numerals designate the same or corresponding parts or elements as those shown in FIGS. 1 and 2. The reference numeral 18 designates a projection formed at a metal cylindrical body 7. The projection 18 is formed by pressing from the outside toward the inside at the portion over the entire periphery of the side wall of the cylindrical body 7 corresponding to the outer peripheral edge of the upper surface of the leaf spring 6c of leaf springs 6a, 6b and 6c of compressed state. Then, the projection 7 is formed to engage with the outer peripheral edge of the upper surface of the leaf spring 6c of the leaf springs 6a, 6b and 6c in their compressed state.

In the embodiment described above, a diode element 1 is a semiconductor element in which a first main electrode is formed on one main surface and a second main electrode of opposite polarity to the first main electrode is formed on the other main surface. In other words, an anode is formed on one main surface, and a cathode is formed on the other main surface. The first and second main electrode conductors are anode conductor 2 and cathode conductor 3, respectively. The leaf springs 6a, 6b and 6c form a cylindrical elastic body.

Figure 3:
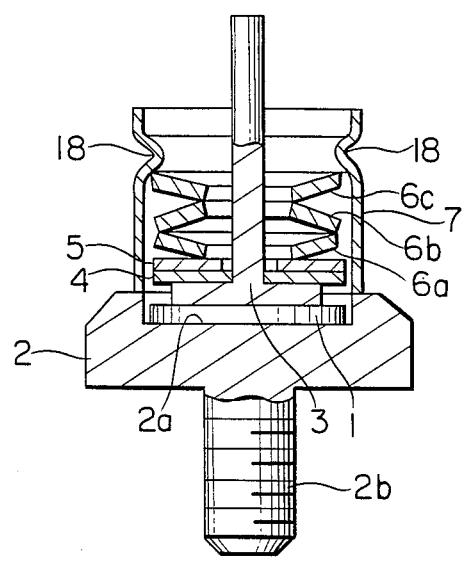
FIG. 3 is a cross-sectional view of a pressure-contact type semiconductor device formed according to one embodiment of the present invention.
Figure 4:
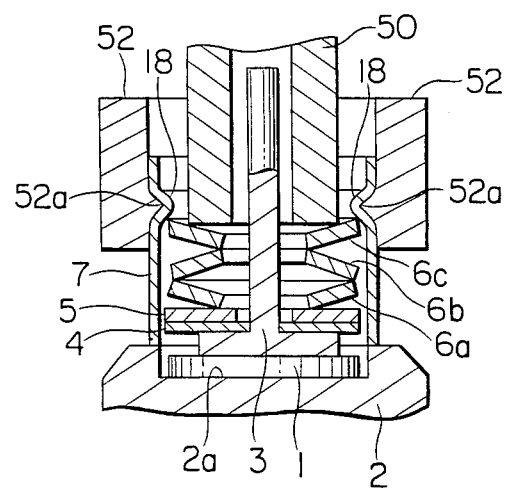
FIG. 4 is a partial cross-sectional view for explaining the method of producing the projections engaged with the leaf springs of compressed state at the side wall of the cylindrical body illustrated in this embodiment of FIG. 3.

FIG. 4 is a partial cross-sectional view for explaining the method of forming the projection 18 in the embodiment of FIG. 3.

In FIG. 4, the same reference numerals as those shown in FIGS. 1 to 3 designate the same or equivalent members or elements. The reference numeral 52 designates a projection forming jig, and this jig 52 has an inner peripheral surface of the same inner diameter as the outer diameter of the cylindrical body 7 and split structures of cylindrical shape divided into three sections in the peripheral direction. The projection 52a is provided on the inner peripheral surface of the jig, and the projection 18 is formed by pressing the jig to the inside of the side wall of the cylindrical body 7.

When the projection 18 is formed at the cylindrical body 7 by using the projection forming jig 52, the leaf springs 6a, 6b and 6c are first pressed by the jig 50 into a compressed state having a predetermined spring pressure. Then, the projection forming jig 52 is disposed outside the cylindrical body 7 so that the lower end of the projection 52a and the outer peripheral edge of the upper surface of the leaf spring 6c are located in the same plane. Then, when the jig 52 is pressed so that its inner peripheral surface is contacted with the outer peripheral surface of the cylindrical body 7, the portion of the side wall of the cylindrical body 7 to be contacted with the projection 52a of the jig 52 is pressed inward, thereby forming the projection 18 to be engaged with the outer peripheral edge of the upper surface of the leaf spring 6c.

Since the projection 18 is formed in this manner as described above, the deflecting sizes of the leaf springs 6a, 6b and 6c do not alter when the jig 50 is removed after the projection 18 is formed, and the spring pressures of the leaf springs 6a, 6b and 6c can be readily set to a predetermined value. In addition, since small broken pieces (shown by A in FIG. 1) are not produced as in the case of the prior art example when the projection 18 is formed, a short-circuit between the anode and the cathode of the diode element 1 and the resultant decrease in the electric characteristics do not occur.

In the embodiment shown in FIG. 3, the metal washer 5 is used. However, the washer 5 may be omitted if the insulating washer 4 has a strength capable of resisting the spring pressures of the leaf springs 6a, 6b and 6c of their compressed state.

Further, in the embodiments described above, the recess portion 2a is formed on the main surface of the anode conductor 2. However, it is not always necessary to form the recess portion 2a, and the recess portion 2a may be omitted.

In the embodiments described above, the leaf springs 6a, 6b and 6c are used. However, it is not always necessary to use the leaf springs. Alternatively they may be coiled springs or other cylindrical elastic members.

In the embodiments described above, the projection 18 is formed on the portion over the entire periphery of the side wall of the cylindrical body 7. However, the present invention is not limited to the particular embodiments. For example, the projections may be formed at a plurality of positions at intervals in the peripheral direction of the side wall of the cylindrical body 7.

Moreover, in the embodiments described above, the present invention has been described with respect to the case of the diode element 1. However, the present invention is not limited to the particular embodiments. For example, the present invention may be applied to the case of a semiconductor element in which a first main electrode is formed on one main surface and a second main electrode of the opposite polarity to the first electrode is formed on the other main surface.

What is claimed is:

1. A method forming a pressure-contact type semiconductor device, comprising the steps of:
   providing a semiconductor element in which a first main electrode is formed on one main surface and a second main electrode of opposite polarity to the first main electrode is formed on the other surface;
   disposing a first main electrode conductor so that a main surface thereof is in contact with the first main electrode of the semiconductor element;
   disposing a second main electrode conductor having a plate-shaped portion which has a leading rod on a first main surface and a second main surface, so that the second main surface is in contact with second main electrode of the semiconductor element;
   inserting an insulating washer into the second main electrode leading rod of the second main electrode conductor and placing the washer on the first main surface of the plate-shaped portion;
   inserting a cylindrical elastic member over the second main electrode leading rod without contact with the rod and placing the elastic member on the insulating washer so that the washer is between the elastic member and the plate shaped portion;
   securing the lower end of a metal cylindrical body to the main surface of the first main electrode conductor to surround the semiconductor element, the second main electrode conductor, the insulating washer and the elastic member;
   surrounding the side wall portion of the cylindrical body with a jig which is separable along radially and axially extending palnes into a plurality of jig elements;
   compressing the elastic member into a compressed state against the washer so as to compress thee semiconductor element between the first and second main conductors, and holding the elastic member in the compressed state;
   after said step of surrounding, and while holding the elastic member in the compressed state, forming a projection by pressing the side wall portion of the cylindrical body from the outside toward the inside of the cylindrical body with the jig for forming an unbroken inwardly projecting bulge at the position of each jig element so as to engage with the outer peripheral edge of the elastic member and retain the elastic member in the compressed state.

2. The method as in claim 1, wherein the step of holding the elastic member in the compressed state comprises the step of applying a withdrawable compressive force on the elastic member, the method further comprising the step of withdrawing the compressive force after said step of forming a projection.

* * * * *